(12) United States Patent
Fay et al.

(10) Patent No.: US 11,177,222 B2
(45) Date of Patent: Nov. 16, 2021

(54) SEMICONDUCTOR PACKAGES AND ASSOCIATED METHODS WITH ANTENNAS AND EMI ISOLATION SHIELDS

(71) Applicant: Micron Technology, Inc., Boise, ID (US)

(72) Inventors: Owen R. Fay, Meridian, ID (US); Dong Soon Lim, Boise, ID (US); Randon K. Richards, Kuna, ID (US); Aparna U. Limaye, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/524,989

(22) Filed: Jul. 29, 2019

(65) Prior Publication Data

US 2021/0035917 A1 Feb. 4, 2021

(51) Int. Cl.
*H01L 23/58* (2006.01)
*H01L 23/552* (2006.01)
*H01L 23/66* (2006.01)
*H01L 23/31* (2006.01)
*H01L 21/56* (2006.01)
*H01Q 1/22* (2006.01)

(52) U.S. Cl.
CPC .......... *H01L 23/552* (2013.01); *H01L 21/565* (2013.01); *H01L 23/3107* (2013.01); *H01L 23/66* (2013.01); *H01Q 1/2283* (2013.01); *H01L 2223/6677* (2013.01)

(58) Field of Classification Search
CPC ...... H01L 23/552; H01L 23/66; H01Q 1/2283
See application file for complete search history.

(56) References Cited

U.S. PATENT DOCUMENTS

2017/0162514 A1* 6/2017 Deng .................. H01L 23/66
2018/0053735 A1* 2/2018 Ueda .................. H01Q 9/0485
2019/0051615 A1* 2/2019 Nair .................... H01L 23/3675

* cited by examiner

*Primary Examiner* — Suberr L Chi
(74) *Attorney, Agent, or Firm* — Perkins Coie LLP

(57) ABSTRACT

Semiconductor devices with antennas and electromagnetic interference (EMI) shielding, and associated systems and methods, are described herein. In one embodiment, a semiconductor device includes a semiconductor die coupled to a package substrate. An antenna structure is disposed over and/or adjacent the semiconductor die. An electromagnetic interference (EMI) shield is disposed between the semiconductor die and the antenna structure to shield at least the semiconductor die from electromagnetic radiation generated by the antenna structure and/or to shield the antenna structure from interference generated by the semiconductor die. A first dielectric material and/or a thermal interface material can be positioned between the semiconductor die and the EMI shield, and a second dielectric material can be positioned between the EMI shield and the antenna structure. In some embodiments, the semiconductor device includes a package molding over at least a portion of the antenna, the EMI shield, and/or the second dielectric material.

20 Claims, 5 Drawing Sheets

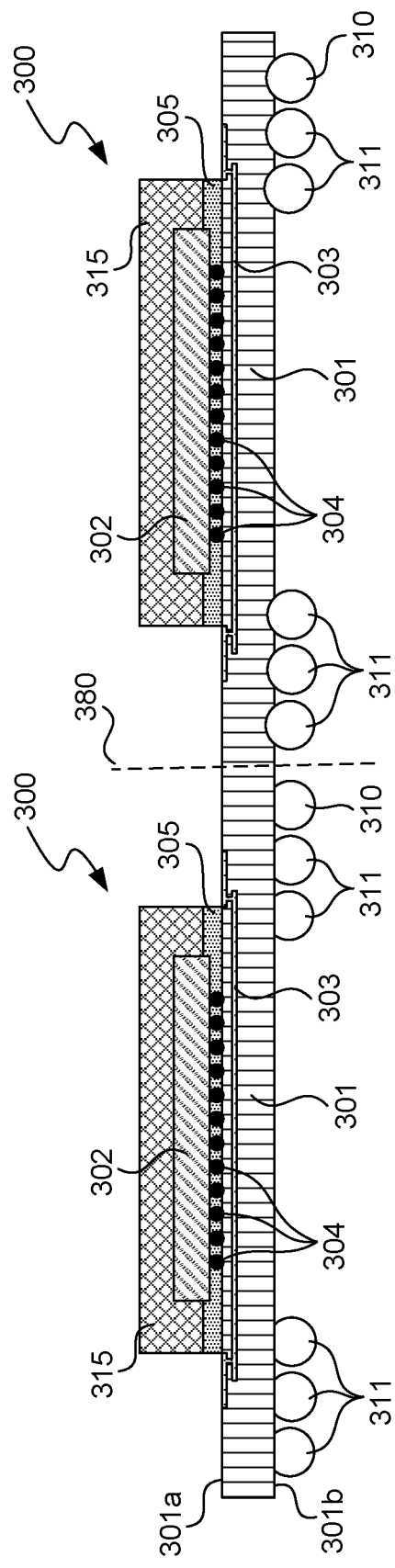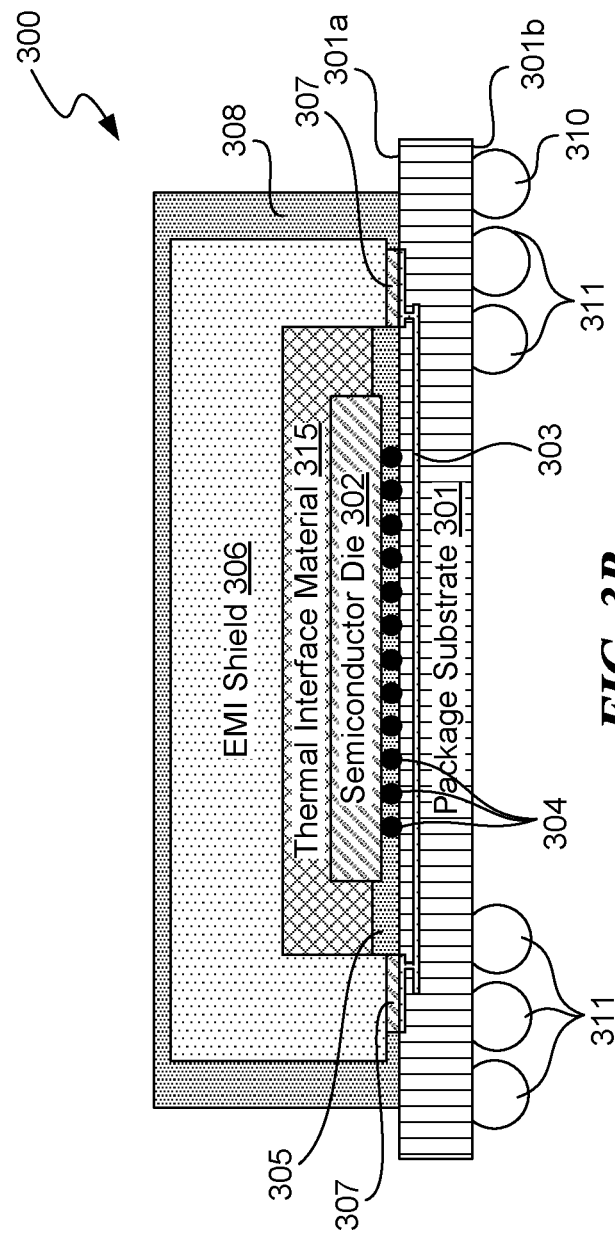
FIG. 3A
FIG. 3B

SEMICONDUCTOR PACKAGES AND ASSOCIATED METHODS WITH ANTENNAS AND EMI ISOLATION SHIELDS

TECHNICAL FIELD

The present disclosure generally relates to semiconductor devices. In particular, the present technology relates to semiconductor devices including semiconductor packages with antennas and electromagnetic interference (EMI) shielding, and associated systems and methods.

BACKGROUND

Semiconductor devices generally have a die (i.e., a chip) that includes integrated circuitry with a high density of very small components. After dies are formed, they are "packaged" and are often incorporated into a variety of systems, including various communications systems. As communication transfer speeds of these systems increase (e.g., as fifth generation (5G) or later wireless technology communication speeds are implemented), the small components, dies, and/or integrated circuitry of the semiconductor devices become susceptible to electromagnetic interference (EMI).

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. The drawings should not be taken to limit the disclosure to the specific embodiments depicted, but are for explanation and understanding only.

FIGS. 3A-3C are cross-sectional views illustrating a semiconductor device at various stages of manufacturing in accordance with various embodiments of the present technology.

DETAILED DESCRIPTION

Specific details of several embodiments of semiconductor devices including semiconductor packages with antennas and electromagnetic interference (EMI) shielding, and associated systems and methods, are described below. In one embodiment, a semiconductor device includes a semiconductor die coupled to a package substrate. An antenna structure is over and/or adjacent the semiconductor die. An electromagnetic interference (EMI) shield is between the semiconductor die and the antenna structure to shield at least the semiconductor die from electromagnetic radiation generated by the antenna structure and/or to shield at least the antenna structure from interface generated by the semiconductor die. A first dielectric material and/or a thermal interface material can be between the semiconductor die and the EMI shield, and a second dielectric material can be between the EMI shield and the antenna structure. In some embodiments, the semiconductor device includes a package molding over at least a portion of the antenna, the EMI shield, and/or the second dielectric material.

Specific details of several embodiments of the present technology are described herein with reference to FIGS. 1-4. Although many of the embodiments are described with respect to semiconductor devices, systems, and methods with antenna and EMI shielding, other applications and other embodiments in addition to those described herein are within the scope of the present technology. Further, embodiments of the present technology can have different configurations, components, and/or procedures than those shown or described herein. Moreover, a person of ordinary skill in the art will understand that embodiments of the present technology can have configurations, components, and/or procedures in addition to those shown or described herein and that these and other embodiments can be without several of the configurations, components, and/or procedures shown or described herein without deviating from the present technology.

As used herein, the terms "vertical," "lateral," "upper," "lower," "top," and "bottom" can refer to relative directions or positions of features in the semiconductor devices in view of the orientation shown in the figures. For example, "bottom" can refer to a feature positioned closer to the bottom of a page than another feature. These terms, however, should be construed broadly to include semiconductor devices having other orientations, such as inverted or inclined orientations where top/bottom, over/under, above/below, up/down and left/right can be interchanged depending on the orientation.

Figure 1:
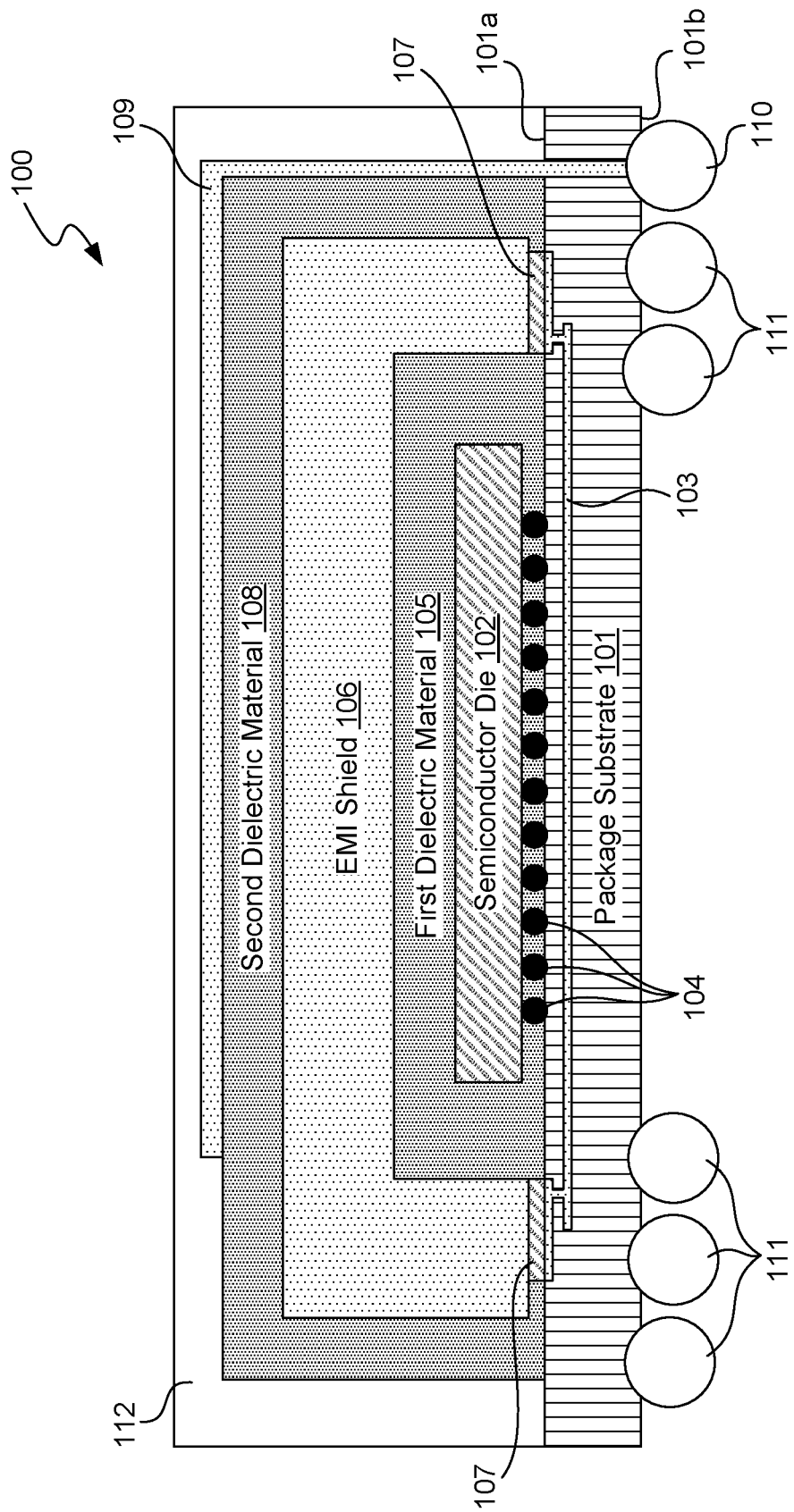
FIG. 1 is a cross-sectional view of a semiconductor device configured in accordance with various embodiments of the present technology.

FIG. 1 is a cross-sectional view of a semiconductor device 100 ("device 100") configured in accordance with various embodiments of the present technology. As shown, the device 100 includes a package substrate 101, a semiconductor die 102 electrically coupled to the package substrate 101 (e.g., via conductive features 104 and corresponding contacts (not shown)), and a first dielectric material 105 over at least a portion of the package substrate 101 and the semiconductor die 102. The first dielectric material 105 can also underfill under the semiconductor die 102. The package substrate 101 includes a first surface 101a and a second surface 101b opposite the first surface 101a. The package substrate 101 also includes one or more conductive lines extending through the substrate 101 to electrically couple various components of the device 100 (e.g., to one another and/or to other components external to the device 100). For example, the package substrate 101 includes an embedded ground plane 103, at least a portion of which is exposed and/or accessible (e.g., via the first surface 101a of the package substrate 101). The ground plane 103 serves as a return path for current from various components in the device 100 and ensures that the ground connections of all components of the device 100 are at the same reference potential.

The device 100 further includes an electromagnetic interference (EMI) shield or lid 106, a second dielectric material 108, and an antenna structure 109. As shown in FIG. 1, the EMI shield 106 (i) is over at least a portion of the first dielectric material 105, the semiconductor die 102, and/or the package substrate 101, and (ii) is electrically coupled to the ground plane 103 through the first surface 101a of the package substrate 101 via a conductive lid attach adhesive or epoxy 107. In some embodiments, the EMI shield 106 includes a ferrous material, such as iron, nickel-iron, cobalt-iron, stainless steel, and/or one or more other iron alloys. In these and other embodiments, the EMI shield 106 includes copper and/or a copper alloy (e.g., of a copper film or a copper foil). In these and still other embodiments, the EMI shield 106 includes one or more other materials, such as one or more other thermally conductive materials. In some embodiments, the EMI shield 106 has a thickness in the range of 1 μm to 30 μm. In these and other embodiments, the EMI shield 106 has a thickness in the range of 5 μm to 15 μm (e.g., 10μ,) for thin coatings.

The first dielectric material 105 separates and electrically insulates the semiconductor die 102 from the EMI shield 106, and the second dielectric material 108 separates and electrically insulates the EMI shield 106 from the antenna structure 109. In some embodiments, one or both of the first dielectric material 105 and/or the second dielectric material 108 can be a non-conductive film. In these and other embodiments, the first and second dielectric materials 105 and 108 can be formed of the same or different materials.

The antenna structure 109 is configured for wireless communication. As discussed above, when communication speeds of the device 100 increase (e.g., to approximately 4 Gb/s or greater), the antenna structure 109 generates electromagnetic radiation that absent the EMI shield 106 can interfere with and/or be captured as electrical noise by various components of the device 100 proximal the antenna structure 109, such as integrated circuitry and/or conductive lines or contacts of the semiconductor die 102. Similarly, the semiconductor die 102 can generate crosstalk or other interference that can reach and/or interfere with the antenna structure 109. By (i) surrounding the semiconductor die 102 with the EMI shield 106 and (ii) electrically coupling the EMI shield 106 to the ground plane 103 embedded in the package substrate 101, the EMI shield 106 prevents interference (e.g., electromagnetic radiation) generated by the antenna structure 109, the semiconductor die 102, and/or other electrical components of the device 100 from reaching and/or interfering with electrical components of the device 100 positioned on an opposite side of the EMI shield 106. In this manner, the device 100 can employ greater communication speeds without interference than conventional semiconductor devices.

In some embodiments, a package molding material 112, such as an epoxy molding compound, can be formed over at least a portion of the antenna structure 109, the second dielectric material 108, the EMI shield 106, and/or the package substrate 101. In these and other embodiments, various components of the semiconductor device 100 and/or of the semiconductor die 102 can be electrically coupled to components, devices, or systems external to the device 100. For example, the antenna structure 109 can be electrically coupled to an external component (e.g., an application processor) via an isolated antenna connect 110 (e.g., a solder ball) formed on the second surface 101b of the package substrate 101. In these and other embodiments, the device 100 can include one or more other connects or solder balls 111 formed on the second surface 101b of the package substrate 101 to facilitate other electrical connections to components, devices, and/or systems external to the device 100. For example, the solder balls 111 can facilitate electrical connections with another semiconductor device or package, such as another device 100 or a semiconductor device 200 (FIG. 2) configured in accordance with various embodiments of the present technology or a package containing an application processor.

Figure 2:
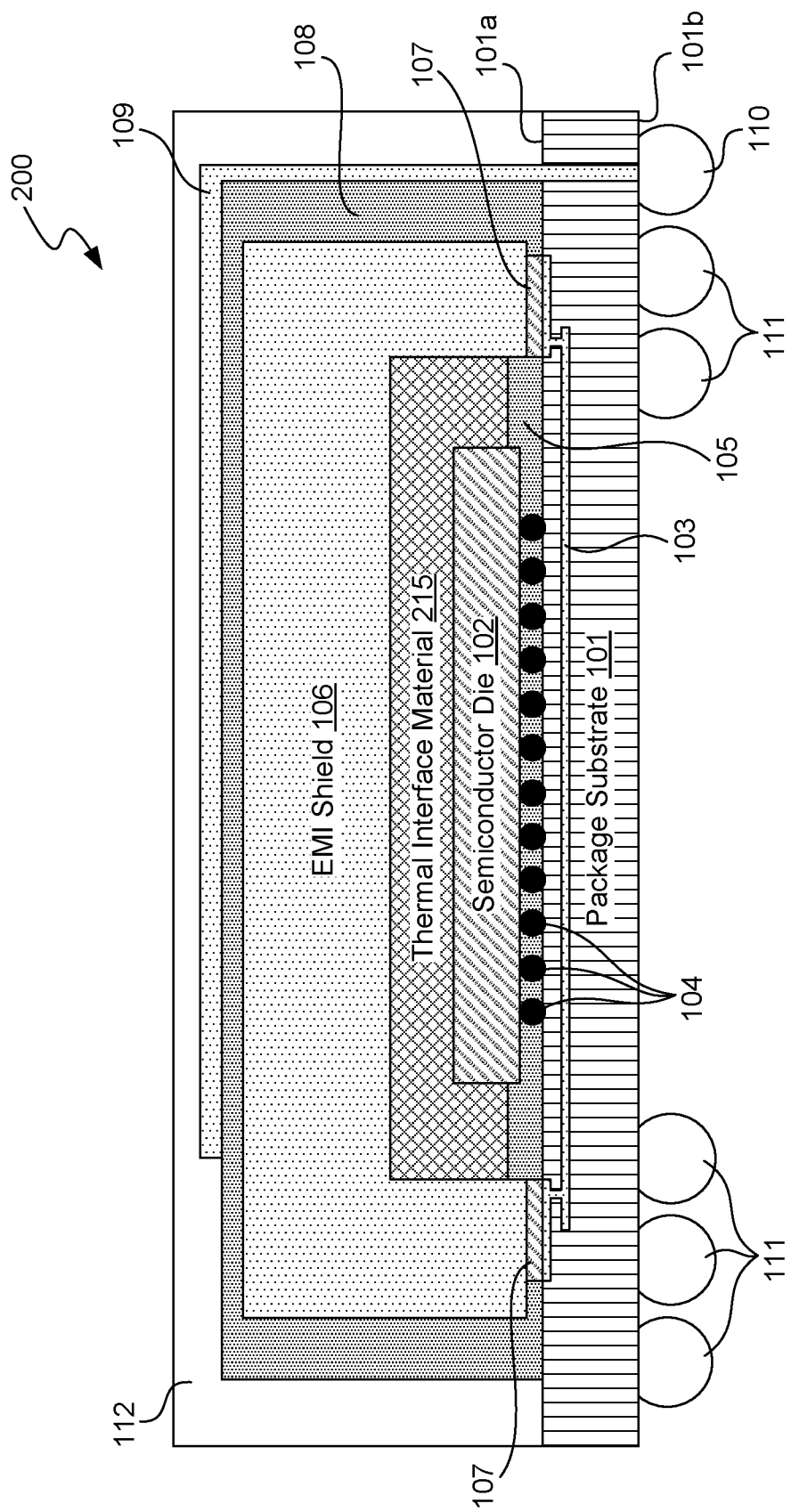
FIG. 2 is a cross-sectional view of another semiconductor device configured in accordance with various embodiments of the present technology.

FIG. 2 is a cross-sectional view of a semiconductor device 200 configured in accordance with various embodiments of the present technology. The device 200 is similar to the device 100 illustrated in FIG. 1. Thus, identical reference numbers identify identical, or at least generally similar, elements. As shown in FIG. 2, however, the device 200 includes a thermal interface material 215 ("TIM 215") over (e.g., directly over) at least a portion of the semiconductor die 102. In some embodiments, the device 200 includes the TIM 215 in lieu of at least a portion of the first dielectric material 105 that is included in the device 100 illustrated in FIG. 1. In these and other embodiments, the TIM 215 can include a ferrous material (e.g., iron, nickel-iron, cobalt-iron, stainless steel, and/or one or more other iron alloys), copper, copper alloy, cobalt, and/or one or more other thermally conductive materials.

The TIM 215 dissipates heat from the semiconductor die 102. In this regard, the EMI shield 106 can be formed or disposed over (e.g., directly over and in contact with) the TIM 215 to transfer heat away from the semiconductor die 102 and out of the device 200. In some embodiments, the device 200 includes a thicker EMI shield 106 and/or a thinner layer of the second dielectric material 108 than included in the device 100 illustrated in FIG. 1 to increase heat transfer from the semiconductor die 102. For example, the EMI shield 106 illustrated in FIG. 2 can have a thickness in the range of 30 μm to 2 mm (e.g., 50μ to 1 mm, or 500 m). In other embodiments, the EMI shield 106 illustrated in FIG. 2 can have a same or similar thickness as the EMI shield 106 illustrated in FIG. 1 (e.g., 1 μm to 30 μm).

Although the device 100 and the device 200 are illustrated in FIGS. 1 and 2, respectively, as including a single semiconductor die 102, devices configured in accordance with other embodiments of the present technology can include a greater number of semiconductor dies 102 (e.g., two or more semiconductor dies 102). For example, devices 100 and/or 200 configured in accordance with various embodiments of the present technology can include two or more semiconductor dies 102 arranged side-by-side on the first surface 101a of the package substrate 101. In these and other embodiments, devices 100 and/or 200 configured in accordance with various embodiments of the present technology can include one or more stacks of semiconductor dies 102. For example, a device 100 and/or a device 200 can include two or more semiconductor dies 102 stacked in a back-to-face, face-to-back, back-to-back, and/or face-to-face orientation on the package substrate 101 (e.g., to form high bandwidth memory, hybrid memory cube memory, or another die stack memory structure). In these and still other embodiments, a device 100 and/or a device 200 can include one or more semiconductor dies 102 stacked on a logic die (not shown).

In some embodiments, the antenna structure 109 can be comprised in a second semiconductor die stacked on and/or over the EMI shield 106. In other embodiments, the device 100 and/or the device 200 can include a second semiconductor die 102 in addition to or in lieu of the antenna structure 109 and/or the second dielectric material 108. In some embodiments, the second semiconductor die 102 can be a controller and/or the second semiconductor die 102 can generate a greater amount of heat than the first semiconductor die 102 (i.e., the semiconductor die 102 beneath and/or within the EMI shield 106). In these embodiments, the EMI shield 106 and/or the first dielectric material 105 can be employed such that the device 100 is configured to transfer a greater amount of heat away from the second semiconductor die 102 than away from the first semiconductor die 102. In other embodiments, the first semiconductor die 102 can be a controller and/or can generate a greater amount of heat than away from the second semiconductor die 102. In these embodiments, the EMI shield and the TIM 215 can be employed such that the device 200 is configured to transfer a greater amount of heat away from the first semiconductor die 102 than away from the second semiconductor die 102.

Figure 3C:
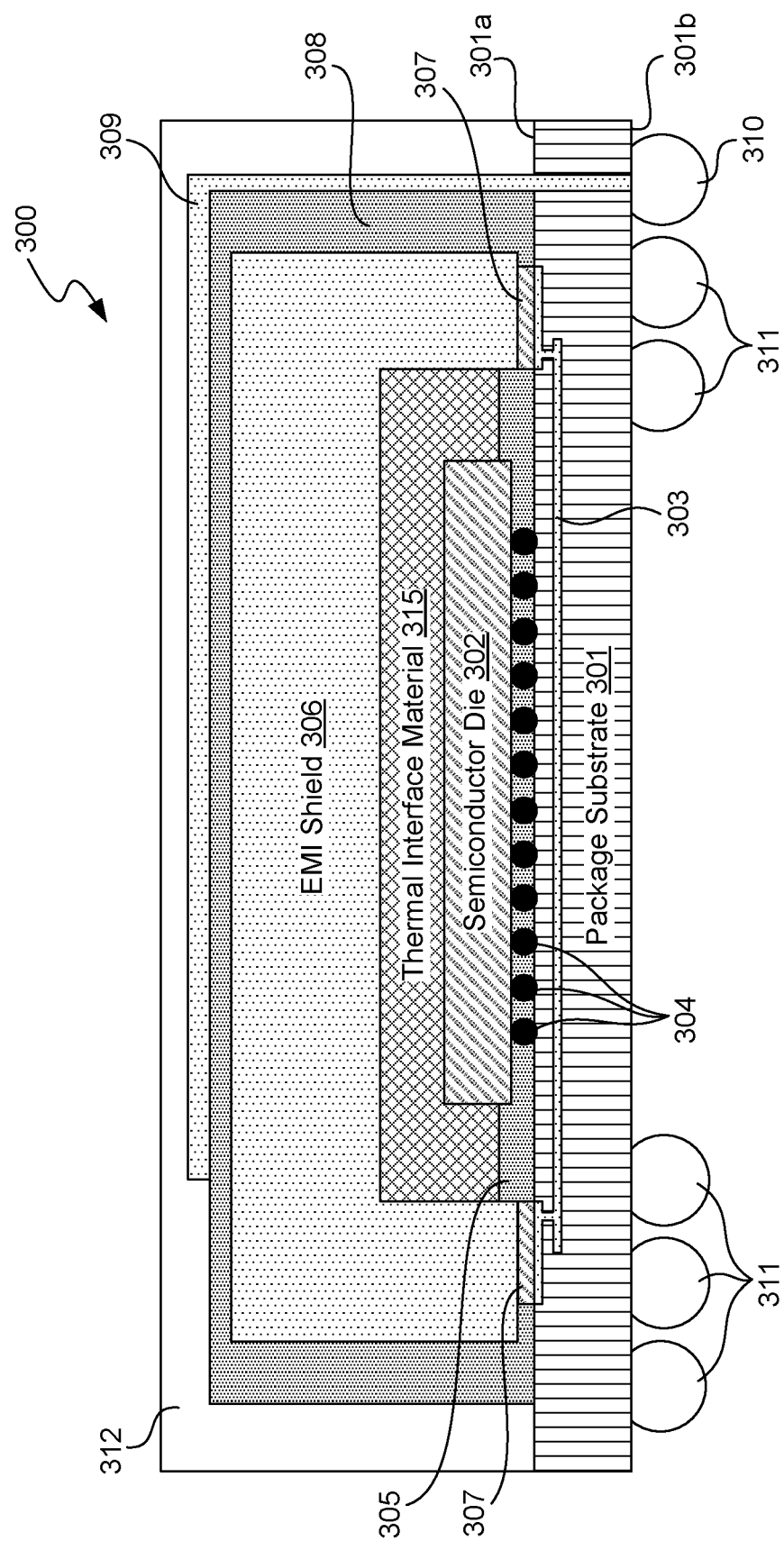

FIGS. 3A-3C are cross-sectional views illustrating a semiconductor device 300 at various stages of manufacturing in accordance with various embodiments of the present technology. Generally, the semiconductor device 300 can be manufactured, for example, as a discrete device or as part of a larger wafer or panel. In wafer-level or panel-level manufacturing, several semiconductor devices are formed together before being singulated to form a plurality of individual semiconductor devices. For ease of explanation and understanding, FIGS. 3A-3C illustrate the fabrication of two semiconductor devices 300. However, one skilled in the art will readily understand that the fabrication of the semiconductor devices 300 can be scaled to the wafer and/or panel level—that is, to include many more components so as to be capable of being singulated into more than two semiconductor devices 300—while including similar features and using similar processes as described herein.

Fabrication of the semiconductor devices 300 can begin with formation of a package substrate 301. FIG. 3A illustrates the semiconductor devices 300 after a package substrate 301 is fully formed. As shown, one or more ground traces and/or planes 303 extend within and/or through the package substrate 301. The ground trace(s) and/or plane(s) 303 can be a large area of conductive material (e.g., copper) and can be coupled to a power supply ground terminal VSS. In certain embodiments, the ground trace(s) and/or plane(s) 303 can be a separate layer of the package substrate 301. In other embodiments, the ground trace(s) and/or plane(s) 303 can span multiple layers of the package substrate 301. The ground trace(s) and/or plane(s) 303 serve as a return path for current from various components in the devices 300 and ensure that the ground connection of all components of the devices 300 are at the same reference potential.

The package substrate 301 can further include a plurality of contacts (not shown) and/or conductive lines (not shown), such as conductive vias and/or traces extending within, through, and/or on the package substrate 301 to electrically couple components of the device 300 to one another and/or to components, devices, and/or systems external to the devices 300. In some embodiments, the package substrate 301 is etched to expose one or more conductive lines extending within and/or through the package substrate 301 via a first surface 301a and/or a second surface 301b of the package substrate 301. In these and other embodiments, the etching procedure can expose the ground plane 303 via the first surface 301a. In these and still other embodiments, holes formed in the package substrate 301 via the etching process can be filled with a conductive material to form contacts, vias, and/or traces in the package substrate 301. The contacts and/or conductive lines can be made from copper, nickel, solder (e.g., SnAg-based solder), conductor-filled epoxy, and/or other electrically conductive materials.

Fabrication of the semiconductor devices 300 continues with coupling a plurality of semiconductor dies 302 to die-attach areas on the first surface 301a of the package substrate 301. The semiconductor dies 302 can include various types of semiconductor components and functional features, such as dynamic random-access memory (DRAM), static random-access memory (SRAM), flash memory, or other forms of integrated circuit memory, processing circuitry, imaging components, and/or other semiconductor features. In some embodiments, the semiconductor dies 302 are coupled to the package substrate 301 using one or more solder balls 304 or other contacts. In other embodiments, the semiconductor dies 302 can be coupled to the package substrate 301 using wire bonds or one or more other electrical connectors, such as conductive bumps, pillars, lead frames, etc.

In some embodiments, one or more additional semiconductor dies (not shown) can be stacked on the semiconductor dies 302 to form die stacks, and additional electrical connectors, such as wire bonds and/or through silicon vias (not shown), can be formed to electrically couple the additional semiconductor dies to the package substrate 301. For example, the semiconductor dies 302 and the additional semiconductor dies can be stacked front-to-back, front-to-front, back-to-back, and/or back-to-front. Accordingly, a plurality of die stacks can be separated from each other along the package substrate 301. In some embodiments, a die stack can include a different number of semiconductor dies than another die stack. In these and other embodiments, the additional semiconductor dies can be stacked on the semiconductor dies 302 such that the semiconductor dies 302 are not directly below the additional semiconductor dies, and/or the additional semiconductor dies can have different dimensions or orientations from the semiconductor dies 302. For example, the additional semiconductor dies can be mounted such that they have a portion that overhangs the semiconductor dies 302, or the semiconductor dies 302 can be larger than the additional semiconductor dies such that the additional semiconductor dies are positioned entirely within a footprint of the semiconductor dies 302. In other embodiments, the additional semiconductor dies can be positioned adjacent the semiconductor dies 302 in a side-by-side arrangement.

As shown in FIG. 3A, fabrication of the semiconductor devices 300 continues with forming a first dielectric material 305 on the first surface 301a of the package substrate 301. The first dielectric material 305 can be an underfill material under the semiconductor die 302. The first dielectric material 305 can also be around at least a portion of the semiconductor dies 302. In some embodiments, the first dielectric material 305 can completely cover and/or encapsulate the semiconductor dies 302 (e.g., to electrically isolate the semiconductor dies 302 and/or to protect them from contaminants and physical damage). Alternatively, as shown in the illustrated embodiment, the first dielectric material 305 surrounds only a bottom portion of the semiconductor dies 302 (e.g., to electrically isolate and/or protect electrical connections between the semiconductor dies 302 and the package substrate 301) while leaving at least a portion of the upper portion of the semiconductor dies 302 exposed. The first dielectric material 305 can provide structural strength to the device 300.

In some embodiments, fabrication of the semiconductor devices 300 continues with forming a thermal interface material 315 ("TIM 315") over the semiconductor dies 302. The TIM 315 can be formed directly over the semiconductor dies 302. In these and other embodiments, the TIM 315 can cover at least a portion of the upper portion of the semiconductor dies 302 exposed through the first dielectric material 305. For example, the TIM 315 can completely cover a top portion of the semiconductor dies 302 and/or at least a portion of the sides of the semiconductor dies 302. The TIM 315 is formed of materials that facilitate heat dissipation away from the semiconductor dies 302.

Fabrication of the semiconductor devices 300 can continue with forming electrical connectors 310 and/or 311 or contacts (not shown) exposed via or formed through the second surface 301b of the package substrate 301. In this regard, a solder mask (not shown) can be applied to the second surface 301b of the package substrate 301 and etched to form a plurality of openings (not shown) through the solder mask and/or through the second surface 301b of the package substrate 301. For example, the etching can expose contacts through the second surface 301b of the package substrate 301 by removing a portion of the package substrate 301. As another example, the contacts can be exposed by removal of the portion of the package substrate 301 before applying and/or etching the solder mask (e.g., during removal of a carrier substrate (not shown)). Solder and/or conductive epoxy can be filled into the plurality of openings to form solder balls 310 and/or 311 and/or one or more other electrical connectors. For example, a stenciling machine can deposit discrete blocks of solder paste onto the exposed contacts of the package substrate 301.

All or a portion of the solder mask can be removed, and solder and/or conductive epoxy deposited onto the exposed contacts through the plurality of openings in the second surface 301b of the package substrate 301 can be used to form the electrical connectors. For example, solder can be reflowed to form a plurality solder balls or solder bumps 310 and/or 311 to form a ball grid array. Alternatively, the deposited solder and/or conductive epoxy can be used to form conductive pillars, conductive lands, and/or other suitable electrically conductive elements (e.g., to form a land grid array). As discussed above, the electrical connectors (e.g., the solder balls 310 and/or 311) are configured to electrically couple the devices 300 to external circuitry (not shown). In other embodiments, the electrical connectors can be omitted, and contacts (not shown) of the package substrate 301 can be directly connected to external devices or circuitry.

Fabrication can continue by singulating the semiconductor devices 300. In this regard, the package substrate 301 can be cut at a plurality of dicing lanes 380, This procedure separates the semiconductor devices 300 from one another.

Referring now to FIG. 3B, which shows processing a single device but can be done at a panel level as in FIG. 3A, fabrication continues by applying an electromagnetic interference (EMI) shield 306 over a semiconductor die 302 of a singulated semiconductor device 300 to shield the semiconductor die 302 from electromagnetic interference. In some embodiments, the EMI shield 306 can be formed over the TIM 315, the first dielectric material 305, and/or the semiconductor die(s) 302. For example, the EMI shield 306 can be applied and formed over the first surface 301a of the package substrate 301 using chemical vapor deposition, physical vapor deposition, sputtering, lamination, and/or one or more other procedures (e.g., plating, vacuum printing, vacuum deposition, insert molding, spray coating, etc.). Alternatively, the EMI shield 306 can be preformed and subsequently attached to the package substrate 301. When the EMI shield 306 is formed over or attached to the package substrate 301, an electrical connection between the EMI shield 306 and the ground plane 303 is formed through the first surface 301a of the package substrate 301. Alternatively, the EMI shield 306 can be coupled to the ground plane 303 through the second surface 301b and/or a side surface of the package substrate 301. A conductive lid attach adhesive 307 can be used to facilitate the electrical connection of the EMI shield 306 to the ground plane 303.

A second dielectric material 308 can be formed over at least a portion of the EMI shield 306. In some embodiments, the second dielectric material 308 is formed over the EMI shield 306 after the EMI shield 306 is formed over and/or attached to the package substrate 301. In other embodiments, the second dielectric material 308 is formed over at least a portion of the EMI shield 306 prior to the EMI shield 306 being attached to the package substrate 301. The second dielectric material 308 can be formed over the EMI shield 306 using chemical vapor deposition, physical vapor deposition, sputtering, lamination, and/or one or more other procedures (e.g., plating, vacuum printing, vacuum deposition, insert molding, spray coating, etc.).

Referring now to FIG. 3C, fabrication of the device 300 continues by forming or attaching an antenna structure 309 configured for wireless communication. In some embodiments, the antenna structure 309 is formed over and/or adjacent at least a portion of the second dielectric material 308 and/or at least a portion of the EMI shield 306 after the EMI shield 306 and the second dielectric material 308 are formed over and/or attached to the package substrate 301. In other embodiments, the antenna structure 309 is formed over and/or adjacent the second dielectric material 308 and/or the EMI shield 306 prior to the EMI shield 306 and the second dielectric material 308 being attached to the package substrate 301. The antenna structure 309 can be formed using chemical vapor deposition, physical vapor deposition, sputtering, lamination, and/or one or more other procedures (e.g., plating, vacuum printing, vacuum deposition, insert molding, spray coating, etc.).

When the antenna structure 309 is formed over or attached to the package substrate 301, an electrical connection between the antenna structure 309 and an isolated electrical connector 310 (e.g., a solder ball) is formed. In some embodiments, the electrical connection is formed through the first surface 301a of the package substrate 301. In these and other embodiments, the electrical connection is formed through the second surface 301b and/or a side surface of the package substrate 301. A conductive adhesive (not shown) can be used to facilitate the electrical connection. Additionally, or alternatively, a contact (e.g., a TSV, wire bond, etc.) or conductive line in the package substrate 301 can be used to facilitate the electrical connection. The contact or conductive line can be exposed through the first surface 301a of the package substrate 301 and/or formed within the package substrate 301 during an etching procedure performed prior to forming or attaching the antenna structure 309.

In some embodiments, a package molding or an epoxy molding compound (EMC) 312 can be applied over at least a portion of the antenna structure 309, the second dielectric material 308, the EMI shield 306, and/or the package substrate 301. The package molding 312 can provide structural strength to the device 300. For example, the package molding 312 can be selected to prevent the device 300 from warping, bending, etc., as external forces are applied to the device 300. The package molding 312 may be formed from a resin, epoxy resin, silicone-based material, polyimide, and/or other suitable resin used or known in the art. Once deposited, the package molding 312 in some embodiments can be cured by UV light, chemical hardeners, heat, or other suitable curing methods known in the art.

Although the fabrication steps discussed above with respect to FIGS. 3A-3C are discussed and illustrated in a particular order, the fabrication steps are not so limited. In other embodiments, the fabrication steps can be performed in a different order. In these and other embodiments, any of the fabrication steps can be performed before, during, and/or after any of the other fabrication steps. For example, any one or more of the etching procedures can be performed before, during, or after any of the other fabrication steps. As another example, although fabrication of the devices 300 illustrated in FIGS. 3A-3C includes singulating the devices 300 before forming/attaching the EMI shield 306, the second dielectric material 308, the antenna structure 309, and/or the package molding 312, fabrication of the devices 300 in other embodiments can include dicing the devices 300 along the dicing lanes 380 before, during, and/or after forming/attaching the EMI shield 306, the second dielectric material 308, the antenna structure 309, and/or the package molding 312. Furthermore, a person of ordinary skill in the art will readily recognize that the fabrication steps can be altered and still remain within these and other embodiments of the present technology. For example, one or more of the fabrication steps can be omitted and/or repeated in some embodiments. In these and other embodiments, fabrication of the semiconductor devices 300 can include additional fabrication steps. For example, fabrication can include one or more finishing and/or polishing steps (e.g., to remove burrs and/or excess or unwanted material).

Figure 4:
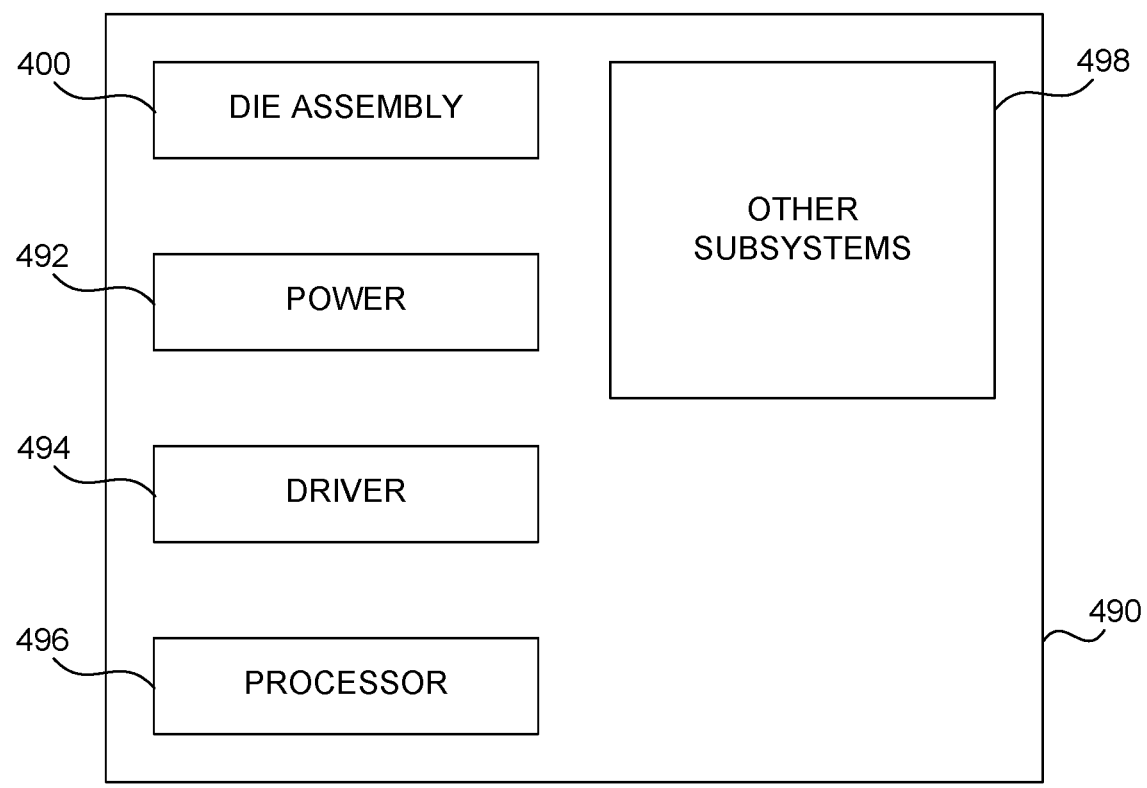
FIG. 4 is a schematic view of a system that includes a semiconductor device configured in accordance with various embodiments of the present technology.

Any one of the semiconductor devices described above with reference to FIGS. 1-3C can be incorporated into any of a myriad of larger and/or more complex systems, a representative example of which is system 490 shown schematically in FIG. 4. The system 490 can include a semiconductor die assembly 400, a power source 492, a driver 494, a processor 496, and/or other subsystems or components 498. The semiconductor die assembly 400 can include semiconductor devices with features generally similar to those of the semiconductor devices described above. The resulting system 490 can perform any of a wide variety of functions, such as memory storage, data processing, and/or other suitable functions. Accordingly, representative systems 490 can include, without limitation, hand-held devices (e.g., mobile phones, tablets, digital readers, and digital audio players), computers, appliances, and vehicles. Components of the system 490 may be housed in a single unit or distributed over multiple, interconnected units (e.g., through a communications network). The components of the system 490 can also include remote devices and any of a wide variety of computer-readable media.

Conclusion

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented in a given order, alternative embodiments can perform steps in a different order. Furthermore, the various embodiments described herein can also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms can also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Furthermore, as used herein, the phrase "and/or" as in "A and/or B" refers to A alone, B alone, and both A and B. Additionally, the terms "comprising," "including," "having" and "with" are used throughout to mean including at least the recited feature(s) such that any greater number of the same feature and/or additional types of other features are not precluded.

From the foregoing, it will also be appreciated that various modifications can be made without deviating from the technology. For example, various components of the technology can be further divided into subcomponents, or various components and functions of the technology can be combined and/or integrated. Furthermore, although advantages associated with certain embodiments of the technology have been described in the context of those embodiments, other embodiments can also exhibit such advantages, and not all embodiments need necessarily exhibit such advantages to fall within the scope of the technology. Accordingly, the disclosure and associated technology can encompass other embodiments not expressly shown or described herein.

We claim:

1. A semiconductor device, comprising:
    a package substrate having a ground plane embedded beneath a first surface of the package substrate and accessible via the first surface of the package substrate;
    a semiconductor die coupled to the first surface of the package substrate;
    an antenna structure configured for wireless communication; and
    an electromagnetic interference (EMI) shield surrounding at least a portion of the semiconductor die and between the semiconductor die and the antenna structure, wherein the EMI shield is electrically coupled to the ground plane via the first surface, and wherein the EMI shield is configured to shield at least the semiconductor die from electromagnetic interference.

2. The semiconductor device of claim 1, further comprising a first dielectric material between the semiconductor die and the EMI shield, wherein the first dielectric material is configured to separate and electrically isolate the EMI shield from the semiconductor die.

3. The semiconductor device of claim 2, wherein the EMI shield has a thickness between 1 μm and 30 μm.

4. The semiconductor device of claim 1, further comprising a first underfill material between the package substrate and the semiconductor die, wherein the first underfill material is configured to electrically isolate electrical connections between the semiconductor die and contacts of the package substrate formed via the first surface of the package substrate.

5. The semiconductor device of claim 4, further comprising a thermal interface material (TIM) between the semiconductor die and the EMI shield, wherein the TIM is configured to dissipate heat away from the semiconductor die.

6. The semiconductor device of claim 5, wherein the EMI shield has a thickness between 30 μm and 2 mm.

7. The semiconductor device of claim 5, wherein the TIM covers (i) an upper surface of the semiconductor die opposite the first surface of the package substrate and (ii) at least a portion of side surfaces of the semiconductor die.

8. The semiconductor device of claim 1, further comprising a second dielectric material between the EMI shield and the antenna structure, wherein the second dielectric material is configured to separate and electrically isolate the EMI shield from the antenna structure.

9. The semiconductor device of claim 7, wherein the second dielectric material surrounds the EMI shield such that the second dielectric material wraps around a side of the EMI shield opposite the semiconductor die thereby contacting a bottom surface of the EMI shield.

10. The semiconductor device of claim 1, wherein the EMI shield includes iron, nickel-iron, cobalt-iron, stainless steel, and/or copper.

11. The semiconductor device of claim 1, wherein the EMI shield is die-attached to the first surface of the package substrate.

12. The semiconductor device of claim 1, further comprising an electrical connector formed on a second surface of the package substrate opposite the first surface, wherein the antenna structure is electrically coupled to the electrical connector via the package substrate.

13. The semiconductor device of claim 11, wherein the electrical connector is electrically isolated from the semiconductor die.

14. The semiconductor device of claim 1, wherein the semiconductor die is a memory die.

15. The semiconductor device of claim 1, further comprising a package molding over the antenna structure, the EMI shield, and the first surface of the package substrate.

16. The semiconductor device of claim 1, wherein the ground plane is a separate layer of the package substrate.

17. The semiconductor device of claim 1, wherein the ground plane spans multiple layers of the package substrate.

18. A semiconductor device, comprising:
- a substrate including a ground plane embedded within and spaced apart from a first surface of the substrate, the ground plane accessible via the first surface of the substrate at a first location and accessible via the first surface at a second location different from the first location;
- a semiconductor die positioned over the first surface of the substrate and between the first location and the second location;
- a first dielectric material positioned at least in part between the semiconductor die and the first surface of the substrate;
- an electromagnetic interference (EMI) shield surrounding the semiconductor die and the first dielectric material, wherein the EMI shield is electrically coupled to the ground plane (a) via the first surface of the substrate at the first location and (b) via the first surface of the substrate at the second location;
- a second dielectric material surrounding the EMI shield;
- an electrical connector positioned on a second surface of the substrate opposite the first surface; and
- an antenna structure positioned at least in part over the second dielectric material and electrically coupled to the electrical connector through the first surface of the substrate and through the second surface of the substrate.

19. The semiconductor device of claim 18, further comprising a thermal interface material (TIM) (i) positioned between the semiconductor die and the EMI shield and (ii) directly contacting the EMI shield and the semiconductor die.

20. A semiconductor device, comprising:
- a package substrate including a ground plane, the ground plane having a first portion embedded beneath a first surface of the package substrate and a second portion exposed though the first surface of the package substrate and electrically coupled to the first portion;
- a semiconductor die coupled to the first surface of the package substrate;
- an antenna structure; and
- an electromagnetic interference (EMI) shield at least partially positioned between the semiconductor die and the antenna structure, wherein the EMI shield is electrically coupled to the first portion of the ground plane via the second portion of the ground plane exposed through the first surface of the package substrate.

\* \* \* \* \*